United States Patent [19]

Foller et al.

[11] Patent Number: 5,135,775
[45] Date of Patent: Aug. 4, 1992

[54] PROCESS FOR PLASMA-CHEMICAL CLEANING PRIOR TO PVD OR PECVD COATING

[75] Inventors: Michael Foller, Krefeld; Carl-Stefan Thöne, Schnaittach, both of Fed. Rep. of Germany

[73] Assignee: Thyssen Edelstahlwerke AG, Krefeld, Fed. Rep. of Germany

[21] Appl. No.: 786,267

[22] Filed: Nov. 1, 1991

[30] Foreign Application Priority Data

Nov. 2, 1990 [DE] Fed. Rep. of Germany ....... 4034842

[51] Int. Cl.$^5$ .................................................. B05D 3/06
[52] U.S. Cl. ..................................... 427/38; 427/45.1; 427/57; 427/248.1; 427/295; 427/318
[58] Field of Search ............... 427/38, 45.1, 57, 248.1, 427/295, 318

Primary Examiner—Bernard Pianalto
Attorney, Agent, or Firm—Kenyon & Kenyon

[57] ABSTRACT

The invention provides a process for cleaning and subsequent coating of metal surfaces of substrates. The metal surfaces are cleaned with a microwave-excited plasma using oxygen and hydrogen, alternately, as a working gas. The cleaned metal surface is coated by physical vapor deposition (PVD) or plasma enhanced chemical vapor deposition (PECVD).

11 Claims, 1 Drawing Sheet

Degreased HSS test rods coated with:

a: water spot, deionized water b: wetting agent c: anti-corrosion agent d: silicon oil Degreased HSS test rods coated with:

a: water spot, deionized water b: wetting agent c: anti-corrosion agent d: silicon oil

PROCESS FOR PLASMA-CHEMICAL CLEANING PRIOR TO PVD OR PECVD COATING

FIELD OF THE INVENTION

The invention relates to a process for the plasma-chemical cleaning of metal substrates prior to PVD or PECVD coating by microwave plasmas.

BACKGROUND OF THE INVENTION

The adhesion of layers separated by the PVD (physical vapor deposition) or PECVD (plasma enhanced chemical vapor deposition) processes is due to chemical bondings. Consequently the surfaces to be coated must be free from contaminations on the atomic scale, in order to ensure that the atoms of the layer approach as closely as possible the atoms of the surface of the substrate.

The initial state of a surface to be coated is generally ill-defined. Starting from the undisturbed basic structure of the substrate material, the following layers may be present, frequently even simultaneously:
  material changed by the shaping process
  a solid layer of contaminations, such as residues of rolling oils, cooling lubricants, ancillary grinding or polishing agents, oxides, oil carbon
  a layer of adsorbate, for example, anti-corrosion agent, water
  a loose layer of solid contaminations such as, for example, dust.

The precise structure of the layer depends in detail on the whole prehistory of the workpiece. In the majority of cases in the prior art this ill-defined structure of the surface means that the workpieces must be subjected to a multi-stage complicated preliminary treatment in order to bring them into a clearly defined, coatable state.

The process probably most frequently used at the present time to prepare metal surfaces for coating comprises the following main steps:
  rough degreasing in CFC (chlorofluoro hydrocarbon)
  fine washing with aqueous cleaning agents (alkaline, neutral
  flushing with water
  drying in CFC Due to the environmentally harmful effect of the CFCs, considerable efforts have been made to replace their use by other agents for rough degreasing and drying. In the meantime, rough degreasing can be performed using alkaline cleaning agents. Attempts are being made to replace CFC in the drying stage by very high-purity water (conductivity 0.05 µs), with subsequent hot air drying, or by alcohol. These techniques have inter alia the following disadvantages:
  the use of very high-purity water increases the risk of corrosion, more particularly in the case of low-alloyed steels;
  the use of alcohol requires on the one hand comprehensive safety measures (e.g., explosion proofing of the installations) and on the other the distillation system for removing the water, more particularly with fairly large quantities of parts to be cleaned.

We are aware that a Soviet process uses chemically inert organic substances solid at room temperature which enclose impurities on cold surfaces in crystallization. Subsequent flushing with solvents releases the crystals with the impurities from the surface of the workpiece.

In this process the following are problematical:
  the environmental compatibility of the fluorinated salts
  deficient penetration into crevices
  the process is very expensive, due to the extensive preparation installation for regenerating the salts.

In addition to the basic processes here mentioned, frequently further cleaning steps are required:
  treatment in inhibited acids for the removal of oxides
  mechanical treatment by blasting with corundum or glass beads A number of impurities also occur which can be eliminated only to some extent; these include, for example, silicon oils, plastics residues, residues of polishing agents.

Basically the aforedescribed cleaning processes use prior to coating a sputtering treatment—i.e., the substrate surfaces are bombarded with high-energy ions, to remove any impurities which still remain or have reappeared following cleaning. Operations are frequently performed using rare gas ions which are produced by DC glow discharge and accelerated in the direction of the substrate surface. In one variant metal ions are used instead of rare gas ions.

In addition to a DC glow discharge, use is also made of a HF glow discharge at 13.6 MHZ. The advantages of a HF discharge as against a DC discharge are stated in the following points:
  1. A higher degree of ionization is achieved.
  2. Oxides which become positively charged in a DC discharge and therefore prevent ion bombardment, can be effectively removed by a HF discharge, since due to the alternating field the positive charging is cancelled out during the next half-wave by electron bombardment.
  3. Due to the peculiarities of high frequency plasma, a more uniform treatment can be performed on complicated parts or of batches.

The use of HF plasmas with a frequency of 13.6 MHz is found to be disadvantageous from the following aspects:
  it is highly problematical to re-equip and operate coating installations with a system for the production of high frequency plasmas in this frequency range. It is difficult to screen the scattered radiation;
  the sputtering process does not operate selectively—i.e., not only impurities, but also the basic material are attacked;
  the sputtering process involves the occurrence of redeposition effects. Since the process produces hardly any gaseous substances, which can therefore be removed from the plant via the vacuum pumps, the surface atoms knocked out by pulse transmission diffuse through the chamber and condense on the walls or substrates. An optimum cleaning effect can therefore be achieved only if the inner surface of the chamber corresponds to a multiple of the substrate surface. However, if the chamber is charged with a large number of workpieces, the surface ratio is frequently the opposite.

An optimum cleaning process for a subsequent PVD or PECVD coating on metal surfaces should meet the following demands:

1. As universal a cleaning effect as possible for oils, greases, plastics residues, burnt-in, resinified oils, oxides, ancillary grinding and polishing agents,
2. economic to use,
3. environmentally compatible,
4. easy to handle, more particularly on a production line, as automatable as possible,
5. cleaning should be performed in situ in the coating chamber, to avoid recontamination after cleaning and to coat on reactive surfaces,
6. the process must be compatible with the coating technique used, and it must be possible to re-equip existing installations,
7. the substrate surface and the basic material must not be negatively affected by the cleaning process (e.g., roughenings, corrosion),
8. the process must have high efficient penetration into crevices
9. the metal substrate should be exposed on an atomic basis.

SUMMARY OF THE INVENTION

It is an object of the invention to simplify the cleaning of the substrate prior to coating, while at the same time avoiding the use of CFCs. It is also an object of the invention to meet demands 1 to 9. Another object of the invention is to provide a process in which activated substrate surfaces are so produced in situ that subsequently even cold work steels can be coated with firm adhesion at approximately 180° to 300° C. without overheating and thereby softening the steels.

It is more particularly an object of the invention to enable silicon oils to be completely eliminated, since at present by the prior art the removal of silicon is purely a matter of chance.

This problem is solved by the features that the last cleaning stage is performed in a vacuum chamber after the fashion of a cleaning by plasma technology, but with microwave boosting (e.g., 2.5 GHZ), whereafter the PVD or PECVD coating is performed. Oxygen and hydrogen are used alternately as working gas. At least one alternation must be carried out, for example, first oxygen, then hydrogen. A double alternation is even more convenient, for example, in the sequence hydrogen, oxygen, hydrogen.

This is a combination of two processes, namely first a plasma-chemical cleaning by means of plasmas, which are excited by a microwave field, and second, the coating of workpieces by a PVD or PECVD process.

DETAILED DESCRIPTION OF THE INVENTION

Figure 1:
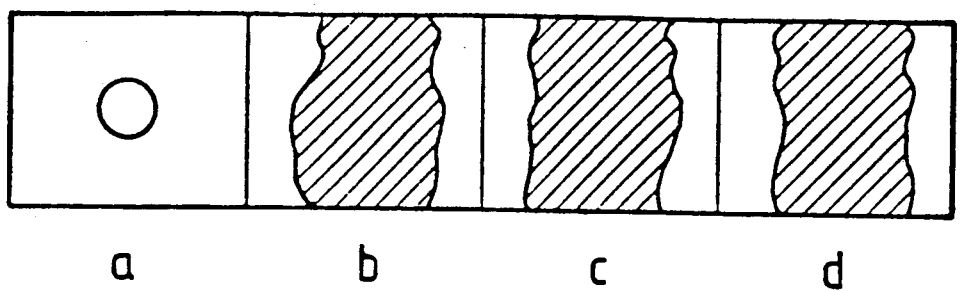

In a plasma excited by an external voltage the degree of ionization of the working gas and the proportion of excited atoms or molecules (radicals) are of course greater, the higher the frequency of the exciting voltage. This means that the effectiveness of a plasma-chemical process also increases with increasing frequency. For this reason the prior art has used microwave plasmas, but in different fields of application, namely for the cleaning and modification of plastics surfaces. It has now been found that microwave plasmas can also be successfully used for metal substrate cleaning directly prior to the coating process. The cleaning of metal surfaces as part of the process according to the invention for a subsequent PVD or PECVD coating can be broken down into the following steps:

1. Rough degreasing in an alkaline cleaning agent, solid components also, such as chips and dust being removed in an ultrasonic bath;
2. flushing in deionized water in a flushing cascade;
3. for the avoidance of dry spots, flushing in very high-purity water with an anti-corrosion additive, or flushing in deionized water with a wetting agent additive to prevent the formation of droplets;
4. drying in hot air or blasting with compressed air or N2 and drying in vacuo. The problems such as, for example, water turning into ice in blind bores, which usually occur during drying in vacuo are obviated by the workpieces being heated in the plasma;
5. Charging the parts in the coating installation or in a separate cleaning chamber, the coating chamber being preferable, since cleaning is performed in situ and no transfer through air is required after the cleaning, such as might again cause the occurrence of oxides and the absorption of dust, gas and water. The chamber used for the plasmachemical cleaning is equipped with one or more microwave plasma sources which operate either in the pressure range between $10^{-4}$ and $10^{-2}$ mbar in the electron cyclotron resonance mode (ECR) or between $10^{-2}$ and 10 mbar with conventional horn radiators. It is also conceivable to equip the chamber with both kinds of plasma sources simultaneously.

It was also discovered that a special apparatus is required for the performance of the invention. During the coating operation the outlet opening of the source should be covered with a closure (shutter) to prevent layer formation on the quartz mandrel of the source and therefore reduced transmission. The shutter can consist, for example, of a plate valve disposed between the chamber and the source or of a plate or a metal sheet which is rotated, pushed, rolled or hinged in front of the outlet opening of the source. The working gases used for the plasma cleaning are hydrogen in the reducing operational phase and oxygen in the oxidizing phase. The admixture of a rare gas is also possible in both phases.

The substrates are possibly applied to a negative potential in relation to the chamber wall, to raise the temperature and therefore accelerate the cleaning reaction and improve the removal of the volatile species produced. The cleaning effect can also be enhanced by ion bombardment in the presence of a rare gas. If drying is performed in the chamber, this is also accelerated by raising the temperature. The reducing phase using hydrogen plasma has the following basic aims:

the reduction of oxides
the decomposition of silicon oils.

The treatment in the hydrogen plasma is followed by an oxidizing treatment in the oxygen plasma (or alternatively in a fluorinated gas), for the decomposition and removal of organic matter. Oils and greases are converted into volatile species, such as $CO$, $CO_2$, $H_2O$, and removed from the installation via the vacuum pumps. In this case also the course followed by an additionally included sputtering process can be boosted by the addition of a rare gas.

The oxidizing treatment is followed by a final reducing phase to reduce the metal oxides produced in the oxygen plasma, so that on completion of the process a highly reactive, activated metal surface is present which is outstandingly well prepared for a subsequent coating of mechanically resistant material.

The excitation of the plasmas by frequencies in the microwave range (e.g., 2.5 GHz) has three special advantages over excitation in the radio frequency range of, for example, 13.6 MHz:
- a higher proportion of ions and radicals,
- no problems with screening, so that existing installations can be re-equipped at low cost,
- no matching problems.

The introduction of plasma-chemical cleaning by means of microwave plasmas results in the following outstanding advantages:
- no environmental nuisance, since the reaction products are safe, no disposal costs,
- avoidance of CFCs,
- a universal cleaning process,
- in situ cleaning,
- in contrast with the sputtering technique, the species removed from the surface are removed from the installation,
- high efficient penetration into crevices
- no effect on the substrate material, no roughening of the surface,
- very simple handling, which can be automated,
- smaller apparatus, reduction in costs and space occupied.

The process according to the invention can also be performed extraordinarily quickly. It was also discovered that the cycle time of the PVD or PECVD installation is lengthened only by 10 to 20 minutes, even if all three component steps boosted by the microwave plasma (reducing/oxidizing/reducing) are performed.

Further special, particularly advantageous embodiments of the invention will now be explained with reference to the subclaims.

The use of the cleaning process in the same chamber as that in which the coating is also performed leads a) to activated metal surfaces which show no fresh coating due to oxygen or/and air humidity,
b) to the simultaneous at least partial cleaning of the chamber furniture such as, for example, the charging frame.

The shutter protects the microwave system during the coating process, it is preferably constructed in the form of a flap which can be actuated computer-controlled.

If one or more ECR plasma sources are used, the pressure is preferably controlled to $10^{-4}$ to $10^{-2}$ mbar during the reducing and oxidizing cleaning phases.

The use of rare gases admixed with $H_2$ or $O_2$ produces the additional "sputtering effect" and lengthens the service life of the radicals produced in the plasma.

A negative potential of up to 5000V in relation to the chamber wall enhances the cleaning effect of the process according to the invention, the sputtering effect being strengthened.

In the case of high-speed steels, a high substrate temperature of up to 500° C. has proved particularly effective during the cleaning. The cycles according to claims 10 to 12 (sic) are preferably so operated that the substrate is preheated from room temperature to coating temperature with the cleaning process. As a result, the cleaning time does not lengthen the total cycle time.

The removal of particles adhering to the substrate by means of ultrasonically boosted baths/washing is known per se and is useful in this case also. The invention will now be described with reference to the exemplary embodiments.

BRIEF AND DETAILED DESCRIPTION OF THE DRAWING

Example 1

Six test rods of HSS (Material No. 1.3207, finished ground) were cleaned by ultrasonics (cold cleaning agent (Eskapon), isopropanol, ether)) and in each case coated in a clearly-defined manner with silicon oil, anti-corrosion oil, wetting agent and a dry spot (cf. FIG. 1).

Then the samples were cleaned by means of microwave plasmas (for parameters: cf. Test Report (Table 1)). Operations were deliberately performed with long treatment times, to achieve a reliable effect and to compensate for the weakening effect of a Faraday cage incorporated in the chamber used.

TABLE 1

REPORT

| Sample No. | Horn Radiator | | | | | |
| --- | --- | --- | --- | --- | --- | --- |
|  | 1 | 2 | 3 | 4 | 5 | 6 |
| Gas 1: ml/min | 02 500 | 02 500 | 02 500 | 02 500 | 02 500 | 02 500 |
| Gas 2: | — | $CF_4$ 50 | — | — | — | — |
| Pressure: mbar | 1.6 | 1.8 | 1.6 | 1.6 | 1.6 | 1.6 |
| HF wattage: watt | 600 | 600 | 600 | 600 | 600 | 600 |
| Process time: min | 45 | 45 | 60 | 75 | 90 | 105 |
| Faraday cage | yes | yes | yes | yes | yes | yes |

Prior to plasma treatment all parts were heated to 250° C with oxygen in a drying cupboard. Following the oxygen treatment a 60 minute reduction was performed in the hydrogen plasma.

The samples were packed in aluminum foil and plastic bags (flushed with inert gas). After approximately 2 weeks the rods were without precleaning coated with TiN, using the PVD process.

Test Results

The adhesive capacity of the PVD layer was used to check the cleaning effect.

Optical Assessment

Point-type layer faults occurred in samples 1, 2, 3 and 6 solely in those zones in which concentrated wetting agent was applied.

To some extent the water spots were still faintly recognizable, but they caused no faults. Otherwise the layers were free from faults.

Scratch Test

The critical loads from the scratch tests are plotted in Table 2.

TABLE 2

Critical load in N

Dependence of the critical load in N on the surface coating and plasma cleaning with different treatment time and gases

| Sample | 1 | 2 | 3 | 4 | 5 | 6 |
|---|---|---|---|---|---|---|
| Coating | | | | | | |
| Water Spot | 70 | 10 | 74 | 78 | 54 | 66 |
| Wetting Agents | | | | | 22 | |
| Anti-Corrosion Oil | 54 | 8 | 49 | 48 | 50 | 46 |
| Silicon oil | 36 | 10 | (0) | 45 | 30 | 66 |

Critical loads of 40–50 N are classified as "satisfactory" in the evaluation of adhesive capacity.

The optical assessment of the scratch track and the critical loads gave the following assessment of adhesive capacity:

Sample 2 ($O_2/CF_4$ treatment) showed poor layer adhesion in all zones, with large-area peelings surrounding the scratch. This is an unexpected result in comparison with the other samples, since as a rule a better cleaning effect is achieved by means of the fluorine gases. Possibly there may have been a process fault during cleaning.

The silicon-affected portions showed low values for the critical load. This is due to the fact that the first treatment was oxidizing, so that $SiO_2$ was produced. However, the removal of silicon operations must first be reducing, to remove the silicon via the formation of $SiH_4$, as a further test showed.

No appreciable problems of adhesion occurred in the zone of the water spots.

No concrete statement can yet be derived therefrom as regards the usability of wetting agents, since the wetting agent was applied undiluted and therefore thick. In normal conditions of use, these are monomolecular layers. Further tests showed that the thin layers of wetting agent could be removed.

Due to the values of the critical loads and the optical assessment of the scratch tracks, in spite of the prolonged intermediate storage, the adhesion of the layer can be characterized as satisfactory to highly satisfactory, more particularly in the zones of the anti-corrosion agent and the water spot. A satisfactory cleaning effect was achieved by means of a microwave plasma and even clearly enhanced by a process performed in situ, as indicated by the second exemplary embodiment.

Example 2

Eight test rods of HSS (Material No. 1.3207, finished ground) were cleaned in a cold cleaning agent (Eskapon) with ultrasonic boosting, flushed with deionized water, immersed in a water bath to which a wetting agent had been added, and dried with hot air (samples 1 to 6) or blasted with compressed air (samples 7 and 8).

The cleaned rods were then lightly smeared with a mixture of an anti-corrosion agent (Lyran C 70) and a silicon oil (DC 704) and charged into a PVD arc installation.

The PVD installation was equipped with a microwave plasma source which could be operated in the ECR (electron cyclotron resonance) mode by means of a solenoid.

Table 3 lists the experimental parameters for the plasma-chemical treatment of the test rods in the microwave plasma.

In each case the plasma cleaning process was started during the pumping down phase, when a pressure of $1 \times 10^{-3}$ mbar was reached. With a similar chamber loading, as a rule a process time of approximately 30 minutes is required from the start of evacuation, including the heating of the workpieces, up to the start of the coating phase. Due to the use of the microwave plasma cleaning, the duration of this phase is extended to approximately 45–50 minutes.

When plasma cleaning had been completed, without interrupting the vacuum the test rods were directly coated with a TiN layer 3 μm thick to check the cleaning effect. Table 3 also lists the values then obtained for the critical load from the scratch test.

These values show that in every case high values were achieved for the critical load—i.e., a satisfactory cleaning effect. Only those samples which were exposed to a pure oxygen plasma in the first treatment step showed a poorer result, as expected. Optical assessment showed layer faults in none of the samples.

TABLE 3

| | Sample ½ | Sample ¾ | Sample ⅚ | Sample ⅞ |
|---|---|---|---|---|
| DC Bias (V) | 0 | | | 300 |
| HF Wattage (W) | 600 | | | 600 |
| Pressure (mbar) | $5 \times 10^{-3}$ | | | $1 \times 10^{-2}$ |
| Duration (min) | 10 | | | 10 |
| Temp. (K) | 330 | | | 380 |
| Gas flux (sccm) | 250 $H_2$ | | | 250 $H_2$ 250 argon |
| DC bias (V) | 0 | 0 | 200 | 300 |
| HF wattage (W) | 600 | 600 | 200 | 600 |
| Pressure (mbar) | $1 \times 10^{-2}$ | $1 \times 10^{-2}$ | $1 \times 10^{-2}$ | $1 \times 10^{-2}$ |
| Duration (min) | 15 | 20 | 20 | 15 |
| Temp. (K) | 380 | 350 | 570 | 570 |
| Gas flux (sccm) | 250 $O_2$ | 250 $O_2$ | 25 $CF_4$/220 $O_2$ | 250 $O_2$ |
| DC bias (V) | 0 | 0 | 200 | 300 |
| HF wattage (W) | 600 | 600 | 600 | 600 |
| Pressure (mbar) | $5 \times 10^{-3}$ | $5 \times 10^{-3}$ | $5 \times 10^{-3}$ | $5 \times 10^{-4}$ |
| Duration (min) | 15 | 15 | 15 | 15 |
| Temp. (K) | 380 | 360 | 630 | 780 |
| Gas flux (sccm) | 250 $H_2$ | 250 $H_2$ | 250 $H_2$ | 250 $H_2$ |
| Critical load (N) | 75/68 | 35/44 | 67/72 | 65/78 |

What is claimed is:

1. A process for cleaning and subsequent coating of metal surfaces comprising the steps of cleaning a metal surface of a substrate with a microwave-excited plasma using, alternately, oxygen and hydrogen as a working gas, with at least one alternation, and coating the cleaned metal surface by a physical vapor deposition process or a plasma enhanced chemical vapor deposition process.

2. The process according to claim 1 wherein the step of cleaning is carried out by treating the metal surface with microwaves inside of a coating chamber having an outlet opening for a microwave plasma source and wherein the step of coating is subsequently conducted in said coating chamber.

3. The process according to claim 2 wherein the outlet opening for the microwave plasma source is covered by a closure means during the step of coating.

4. The process according to claim 3 wherein the step of cleaning is conducted under a working pressure of $10^{-4}$ to $10^{-2}$ mbar.

5. The process according to claim 4 wherein at least one rare gas is admixed to the working gas.

6. The process according to claim 5 wherein the substrate is heated by applying an external voltage of up to 5000 V at a negative potential in relation to a wall of the chamber.

7. The process according to claim 6 wherein the substrate is a tool steel and wherein during the step of cleaning the tool steel substrate is heated from a first temperature to a second temperature not greater than about 600° C.

8. The process according to claim 7 wherein the first temperature is room temperature.

9. The process according to claim 6 wherein the substrate is a hard metal and wherein during the step of cleaning the hard metal substrate is heated from a first temperature to a second temperature not greater than about 750° C.

10. The process according to claim 9 wherein the first temperature is room temperature.

11. The process according to claim 1 further comprising the step of precleaning the metal surface by degreasing, flushing, drying and using ultrasonic waves, prior to the step of cleaning.

* * * * *

UNITED STATES PATENT AND TRADEMARK OFFICE
CERTIFICATE OF CORRECTION

PATENT NO. : 5,135,775
DATED : August 4, 1992
INVENTOR(S) : M. Foller et al.

It is certified that error appears in the above-identified patent and that said Letters Patent is hereby corrected as shown below:

Column 8, line 31, change "$10^{-3}$" to --$10^{-2}$--.

Signed and Sealed this

Nineteenth Day of October, 1993

Attest:

BRUCE LEHMAN

Attesting Officer    Commissioner of Patents and Trademarks